(12) United States Patent
Ise et al.

(10) Patent No.: US 7,754,347 B2
(45) Date of Patent: *Jul. 13, 2010

(54) ORGANIC ELECTROLUMINESCENT DEVICE

(75) Inventors: Toshihiro Ise, Kanagawa (JP); Seiji Ichijima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 940 days.

This patent is subject to a terminal disclaimer.

(21) Appl. No.: 11/528,358

(22) Filed: Sep. 28, 2006

(65) Prior Publication Data

US 2007/0072003 A1 Mar. 29, 2007

(30) Foreign Application Priority Data

Sep. 29, 2005 (JP) ............................ P2005-284829

(51) Int. Cl.
*B32B 9/00* (2006.01)

(52) U.S. Cl. ...................... 428/690; 428/917; 313/504; 544/225; 544/181; 546/2; 257/E51

(58) Field of Classification Search ................. 428/690, 428/917; 544/225, 181; 313/504; 546/2
See application file for complete search history.

(56) References Cited

U.S. PATENT DOCUMENTS

| | | | |
|---|---|---|---|
| 6,303,238 B1 | 10/2001 | Thompson et al. | |
| 2003/0138663 A1* | 7/2003 | Mori et al. | 428/690 |
| 2004/0137268 A1* | 7/2004 | Igarashi et al. | 428/690 |
| 2006/0269780 A1* | 11/2006 | Fukumatsu et al. | 428/690 |

* cited by examiner

*Primary Examiner*—Randy Gulakowski
*Assistant Examiner*—Shane Fang
(74) *Attorney, Agent, or Firm*—Sughrue Mion, PLLC

(57) ABSTRACT

An organic electroluminescent device comprising a pair of electrodes and at least one organic layer between the pair of electrodes, wherein the organic layer contains at least one compound represented by the formula (I), preferably by the formula (II) and more preferably by the formula (III) as defined herein.

13 Claims, No Drawings

ORGANIC ELECTROLUMINESCENT DEVICE

FIELD OF THE INVENTION

The present invention relates to an organic electroluminescent device capable of converting electric energy into light to cause light emission.

BACKGROUND OF THE INVENTION

An organic electroluminescent device is actively researched and developed because light emission with high luminance is obtained by low-voltage drive. The organic electroluminescent device has an organic layer between a pair of electrodes and utilizes energy of an exciton as produced upon recombination of an electron injected from a cathode and a hole injected from an anode in the organic layer for light emission.

In recent years, realization of high efficiency of the device is advancing by using a phosphorescent material. While there have been disclosed inventions regarding a phosphorescence emitting device using, as the phosphorescent material, an iridium complex, a platinum complex or the like, any device capable of making both high efficiency and high durability compatible with each other has not been developed yet.

Also, though there have been made attempts to use a stable metal complex as a host material (see, for example, U.S. Pat. No. 6,303,238), light emission efficiency and durability thereof are not sufficient yet. It is the present situation that the development of a device exhibiting higher light emitting luminance and light emission efficiency and having excellent durability is eagerly demanded.

SUMMARY OF THE INVENTION

An object of the invention is to provide a device having high light emission efficiency and high durability. Another object of the invention is to provide a metal complex compound which is suitably used therefor.

In order to solve the foregoing problems, the present inventors made extensive and intensive investigations. As a result, it has been found that an organic EL device containing a zinc complex of a tetradentate ligand having a specific structure in an organic layer solves the foregoing problems. That is, the invention has been achieved by the following measures.

(1) An organic electroluminescent device having at least one organic layer between a pair of electrodes, wherein the organic layer contains at least one compound represented by the following formula (I).

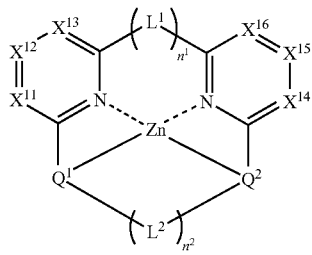

(I)

In the formula (I), $X^{11}$ to $X^{16}$ each independently represents C—R or N; R represents a hydrogen atom or a substituent, provided that Rs (R and other R) are not bound to each other to form a fused aromatic ring; $Q^1$ and $Q^2$ each independently represents a coordinating group which is bound to zinc at the O, N or S atom; $L^1$ and $L^2$ each represents a connecting group; $n^1$ and $n^2$ each represents 0 or 1; and $(n^1+n^2)$ is 1.

(2) The organic electroluminescent device as set forth above in (1), wherein the compound represented by the formula (I) is represented by the following formula (II).

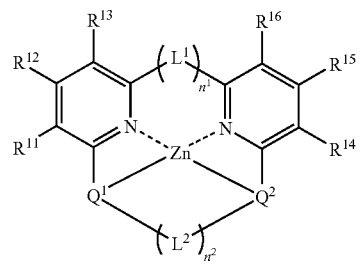

(II)

In the formula (II), $R^{11}$ to $R^{16}$ each independently represents a hydrogen atom or a substituent, provided that any one of $R^{11}$ to $R^{13}$ is not mutually bound to the other to form a fused aromatic ring and that any one of $R^{14}$ to $R^{16}$ is not mutually bound to the other to form a fused aromatic ring; $Q^1$ and $Q^2$ each independently represents a coordinating group which is bound to zinc at the O, N or S atom; $L^1$ and $L^2$ each represents a connecting group; $n^1$ and $n^2$ each represents 0 or 1; and $(n^1+n^2)$ is 1.

(3) The organic electroluminescent device as set forth above in (1) or (2), wherein the compound represented by the formula (I) or (II) is represented by the following formula (III).

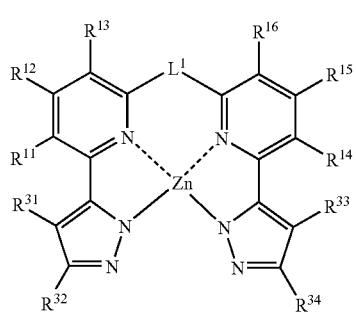

(III)

In the formula (III), $R^{11}$ to $R^{16}$ each independently represents a hydrogen atom or a substituent, provided that any one of $R^{11}$ to $R^{13}$ is not mutually bound to the other to form a fused aromatic ring and that any one of $R^{14}$ to $R^{16}$ is not mutually bound to the other to form a fused aromatic ring; $R^{31}$ to $R^{34}$ each independently represents a hydrogen atom or a substituent; and $L^1$ represents a connecting group.

(4) The organic electroluminescent device as set forth above in any one of (1) to (3), wherein the compound represented by any one of the formulae (I) to (III) has a glass transition temperature of 130° C. or higher and not more than 450° C.

(5) The organic electroluminescent device as set forth above in any one of (1) to (4), wherein the at least one organic layer contains a light emitting material, and at least one light emitting material is a phosphorescent material.

(6) The organic electroluminescent device as set forth above in any one of (1) to (5), wherein the compound represented by any one of the formulae (I) to (III) has a minimum excitation triplet energy level of 65 kcal/mole (273.35 kJ/mole) or more and not more than 95 kcal/mole (398.05 kJ/mole).

The organic electroluminescent device of the invention is characterized by containing at least one member of complexes represented by the formulae (I) to (III) of the invention in an organic layer (in this specification, this complex is synonymous with the terms "complex of the invention"). In this way, it is possible to provide an organic electroluminescent device having high light emission efficiency (for example, external quantum efficiency) and excellent durability (in this specification, this organic electroluminescent device is synonymous with the terms "device of the invention"). Also, by using the complex of the invention having a certain specific structure, it is possible to provide a device capable of causing light emission with high external quantum efficiency in a blue region and having excellent durability.

DETAILED DESCRIPTION OF THE INVENTION

The organic electroluminescent device of the invention has at least one light emitting layer. Besides the light emitting layer, a hole injection layer, a hole transport layer, an electron blocking layer, an exciton blocking layer, a hole blocking layer, an electron transport layer, an electron injection layer, a protective layer, and so on may be properly arranged, and each of these layers may be provided with a function of other layer. Furthermore, each of these layers may be configured of plural secondary layers.

The organic electroluminescent device of the invention may be a device utilizing light emission (fluorescence) from an excitation singlet or may be a device utilizing light emission (phosphorescence) from an excitation triplet. However, from the viewpoint of light emission efficiency, a device utilizing phosphorescence is preferable.

In the case where the organic electroluminescent device of the invention is a device utilizing phosphorescence, it is preferable that the light emitting layer is configured to have at least one phosphorescent material and at least one host material. The "host material" as referred to herein is a material other than a light emitting material among the materials configuring the light emitting layer and means a material having at least one function among a function to disperse a light emitting material and keep it in the layer, a function to receive a hole from an anode, a hole transport layer, etc., a function to receive an electron from a cathode, an electron transport layer, etc., a function to transport a hole and/or an electron, a function to provide a place of the recombination of a hole and an electron, a function to transfer energy of an exciton as produced by the recombination into the light emitting material, and a function to transport a hole and/or an electron into the light emitting material.

The complex of the invention may be contained in any one of the organic layers or may be contained in plural layers. However, the complex of the invention is preferably contained in the light emitting layer, the hole blocking layer, the electron transport layer, or the electron injection layer, and most preferably contained as a host material in the light emitting layer. The content of the complex of the invention in the light emitting layer is preferably from 50 to 99.8% by weight, and more preferably from 60 to 99% by weight.

The complex represented by the formula (I) according to the invention will be hereunder described in detail.

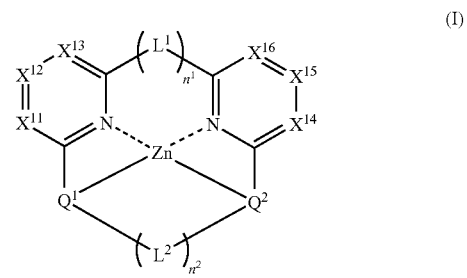

In the formula (I), $X^{11}$ to $X^{16}$ each independently represents C—R or N; R represents a hydrogen atom or a substituent, provided that Rs are not bound to each other to form a fused aromatic ring; $Q^1$ and $Q^2$ each independently represents a coordinating group which is bound to zinc at the O, N or S atom; $L^1$ and $L^2$ each represents a connecting group; $n^1$ and $n^2$ each represents 0 or 1; and ($n^1+n^2$) is 1.

$X^{11}$ to $X^{16}$ each independently represents C—R or N, and R represents a hydrogen atom or a substituent. As the substituent, substituents represented by the following substituent group A are applicable.

(Substituent Group A)

An alkyl group (preferably having from 1 to 30 carbon atoms, more preferably having from 1 to 20 carbon atoms, and especially preferably having from 1 to 10 carbon atoms, for example, methyl, ethyl, isopropyl, tert-butyl, n-octyl, n-decyl, n-hexadecyl, cyclopropyl, cyclopentyl, and cyclohexyl); an alkenyl group (preferably having from 2 to 30 carbon atoms, more preferably having from 2 to 20 carbon atoms, and especially preferably having from 2 to 10 carbon atoms, for example, vinyl, allyl, 2-butenyl, and 3-pentenyl); an alkynyl group (preferably having from 2 to 30 carbon atoms, more preferably having from 2 to 20 carbon atoms, and especially preferably having from 2 to 10 carbon atoms, for example, propargyl and 3-pentynyl); an aryl group (preferably having from 6 to 30 carbon atoms, more preferably having from 6 to 20 carbon atoms, and especially preferably having from 6 to 12 carbon atoms, for example, phenyl, p-meth-ylphenyl, naphthyl, and anthryl); an amino group (preferably having from 0 to 30 carbon atoms, more preferably having from 0 to 20 carbon atoms, and especially preferably having from 0 to 10 carbon atoms, for example, amino, methylamino, dimethylamino, diethylamino, dibenzylamino, diphenylamino, and ditolylamino); an alkoxy group (preferably having from 1 to 30 carbon atoms, more preferably having from 1 to 20 carbon atoms, and especially preferably having from 1 to 10 carbon atoms, for example, methoxy, ethoxy, butoxy, and 2-ethylhexyloxy); an aryloxy group (preferably having from 6 to 30 carbon atoms, more preferably having from 6 to 20 carbon atoms, and especially preferably having from 6 to 12 carbon atoms, for example, phenyloxy, 1-naphthyloxy, and 2-naphthyloxy); a heterocyclic oxy group (preferably having from 1 to 30 carbon atoms, more preferably having from 1 to 20 carbon atoms, and especially preferably having from 1 to 12 carbon atoms, for example, pyridyloxy, pyrazyloxy, pyrimidyloxy, and quinolyloxy); an acyl group (preferably having from 1 to 30 carbon atoms, more preferably having from 1 to 20 carbon atoms, and especially preferably having from 1 to 12 carbon atoms, for example, acetyl, benzoyl, formyl, and pivaloyl); an alkoxycarbonyl group (preferably having from 2 to 30 carbon atoms, more preferably having from 2 to 20 carbon atoms, and especially preferably having from 2 to 12 carbon atoms, for example, methoxycarbonyl and ethoxycarbonyl); an aryloxycarbonyl group (preferably having from 7 to 30 carbon atoms, more preferably having from 7 to 20 carbon atoms, and especially preferably having from 7 to 12 carbon atoms, for example, phenyloxycarbonyl); an acyloxy group (preferably having from 2 to 30 carbon atoms, more preferably having from 2 to 20 carbon atoms, and especially preferably having from 2 to 10 carbon atoms, for example, acetoxy and benzoyloxy); an acylamino group (preferably having from 2 to 30 carbon atoms, more preferably having from 2 to 20 carbon atoms, and especially preferably having from 2 to 10 carbon atoms, for example, acetylamino and benzoylamino); an alkoxycarbonylamino group (preferably having from 2 to 30 carbon atoms, more preferably having from 2 to 20 carbon atoms, and especially preferably having from 2 to 12 carbon atoms, for example, methoxycarbonylamino); an aryloxycarbonylamino group (preferably having from 7 to 30 carbon atoms, more preferably having from 7 to 20 carbon atoms, and especially preferably having from 7 to 12 carbon atoms, for example, phenyloxycarbonylamino); a sulfonylamino group (preferably having from 1 to 30 carbon atoms, more preferably having from 1 to 20 carbon atoms, and especially preferably having from 1 to 12 carbon atoms, for example, methanesulfonylamino and benzenesulfonylamino); a sulfamoyl group (preferably having from 0 to 30 carbon atoms, more preferably having from 0 to 20 carbon atoms, and especially preferably having from 0 to 12 carbon atoms, for example, sulfamoyl, methylsulfamoyl, dimethylsulfamoyl, and phenylsulfamoyl); a carbamoyl group (preferably having from 1 to 30 carbon atoms, more preferably having from 1 to 20 carbon atoms, and especially preferably having from 1 to 12 carbon atoms, for example, carbamoyl, methylcarbamoyl, diethylcarbamoyl, and phenylcarbamoyl); an alkylthio group (preferably having from 1 to 30 carbon atoms, more preferably having from 1 to 20 carbon atoms, and especially preferably having from 1 to 12 carbon atoms, for example, methylthio and ethylthio); an arylthio group (preferably having from 6 to 30 carbon atoms, more preferably having from 6 to 20 carbon atoms, and especially preferably having from 6 to 12 carbon atoms, for example, phenylthio); a heterocyclic thio group (preferably having from 1 to 30 carbon atoms, more preferably having from 1 to 20 carbon atoms, and especially preferably having from 1 to 12 carbon atoms, for example, pyridylthio, 2-benzimidazolylthio, 2-benzoxazolylthio, and 2-benzthiazolylthio); a sulfonyl group (preferably having from 1 to 30 carbon atoms, more preferably having from 1 to 20 carbon atoms, and especially preferably having from 1 to 12 carbon atoms, for example, mesyl and tosyl); a sulfinyl group (preferably having from 1 to 30 carbon atoms, more preferably having from 1 to 20 carbon atoms, and especially preferably having from 1 to 12 carbon atoms, for example, methanesulfinyl and benzenesulfinyl); an ureido group (preferably having from 1 to 30 carbon atoms, more preferably having from 1 to 20 carbon atoms, and especially preferably having from 1 to 12 carbon atoms, for example, ureido, methylureido, and phenylureido); a phosphoric amide group (preferably having from 1 to 30 carbon atoms, more preferably having from 1 to 20 carbon atoms, and especially preferably having from 1 to 12 carbon atoms, for example, diethylphosphoric amide and phenylphosphoric amide); a hydroxyl group; a mercapto group; a halogen atom (for example, a fluorine atom, a chlorine atom, a bromine atom, and an iodine atom); a cyano group; a sulfo group; a carboxyl group; a nitro group; a hydroxamic acid group; a sulfino group; a hydrazino group; an imino group; a heterocyclic group (preferably having from 1 to 30 carbon atoms, and more preferably having from 1 to 12 carbon atoms, with examples of the hetero atom including a nitrogen atom, an oxygen atom, and a sulfur atom, and specific examples of the heterocyclic group including imidazolyl, pyridyl, quinolyl, furyl, thienyl, piperidyl, morpholino, benzoxazolyl, benzimidazolyl, benzthiazolyl, carbazolyl, and azepinyl); a silyl group (preferably having from 3 to 40 carbon atoms, more preferably having from 3 to 30 carbon atoms, and especially preferably having from 3 to 24 carbon atoms, for example, trimethylsilyl and triphenylsilyl); and a silyloxy group (preferably having from 3 to 40 carbon atoms, more preferably having from 3 to 30 carbon atoms, and especially preferably having from 3 to 24 carbon atoms, for example, timethylsilyloxy and triphenylsilyloxy).

$X^{11}$ to $X^{16}$ are each preferably C—R. R is preferably a hydrogen atom, an alkyl group, an aryl group, an alkoxy group, an aryloxy group, an amino group, a cyano group, or a fluorine atom; more preferably a hydrogen atom, an alkyl group, an alkoxy group, or an amino group; and further preferably a hydrogen atom or an alkyl group.

$Q^1$ and $Q^2$ each independently represents a coordinating group which is bound to Zn at the O, N or S atom. $Q^1$ and $Q^2$ each of which is bound to Zn at O are each preferably an anionic coordinating group obtainable by deprotonation from an alcohol or an aryl alcohol, and more preferably an anionic coordinating group obtainable by deprotonation from an aryl alcohol. $Q^1$ and $Q^2$ each of which is bound to Zn at S are each preferably an anionic coordinating group obtainable by deprotonation from a thio alcohol or a thioaryl alcohol, and more preferably an anionic coordinating group obtainable by deprotonation from a thioaryl alcohol. $Q^1$ and $Q^2$ each of which is bound to Zn at N are each preferably an anionic coordinating group obtainable by deprotonation from a disubstituted amino group or a nitrogen-containing aromatic ring having an NH group in the ring thereof, and more preferably an anionic coordinating group obtainable by deprotonation from a nitrogen-containing aromatic ring having an NH group in the ring thereof. $Q^1$ and $Q^2$ are each preferably a coordinating group which is bound to Zn at the O or N atom; more preferably a coordinating group which is bound to Zn at the N atom; further preferably an anionic coordinating group obtainable by deprotonation from a nitrogen-containing aromatic ring having an NH group in the ring thereof; and still further preferably an anionic coordinating group obtainable by deprotonation from a nitrogen-containing aromatic 5-membered ring having an NH group in the ring thereof.

$L^1$ and $L^2$ each represents a single bond or a divalent connecting group. Though the divalent connecting group is not particularly limited, it is preferably a connecting group made of a carbon atom, a nitrogen atom, an oxygen atom, a sulfur atom, a silicon atom, or a halogen atom, and more preferably a connecting group made of a carbon atom. With respect to the length of the connecting group represented by $L^1$ and $L^2$, when the partial structures to be connected to each other are followed along a route of the minimum atom number, the number of atoms configuring $L^1$ and $L^2$ is preferably 1 or more and not more than 10, more preferably 3 or more and not more than 8, and further preferably 4 or more and not more than 7.

Specific examples of the connecting group represented by $L^1$ and $L^2$ will be given below, but it should not be construed that $L^1$ and $L^2$ are limited thereto.

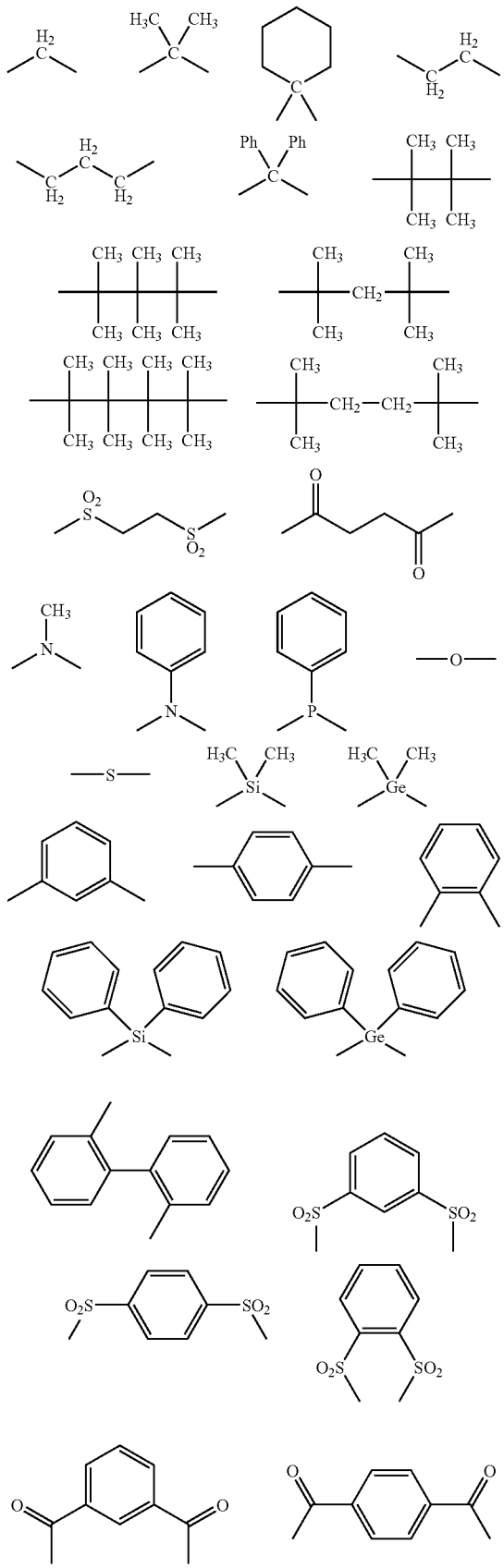

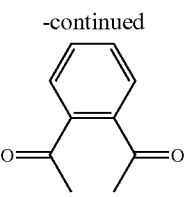

If possible, these connecting groups may further have a substituent. As the substituent which can be introduced, those as enumerated as the substituent group A are applicable.

$n^1$ and $n^2$ each represents 0 or 1; and ($n^1+n^2$) is 1. That is, the ligand of the zinc complex of the invention is tetradentate ligand which does not form a ring.

The complex represented by the formula (I) is more preferably a complex represented by the formula (II).

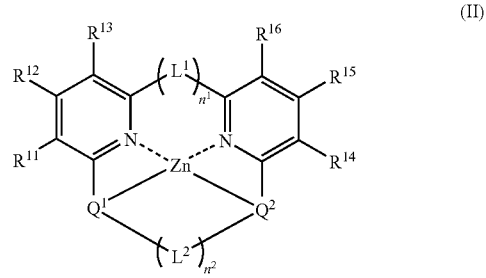

(II)

In the formula (II), $R^{11}$ to $R^{16}$ each independently represents a hydrogen atom or a substituent, provided that any one of $R^{11}$ to $R^{13}$ is not mutually bound to the other to form a fused aromatic ring and that any one of $R^{14}$ to $R^{16}$ is not mutually bound to the other to form a fused aromatic ring; $Q^1$ and $Q^2$ each independently represents a coordinating group which is bound to zinc at the O, N or S atom; $L^1$ and $L^2$ each represents a connecting group; $n^1$ and $n^2$ each represents 0 or 1; and ($n^1+n^2$) is 1.

$Q^1$, $Q^2$, $L^1$, $L^2$, $n^1$ and $n^2$ are synonymous with those in the formula (I), respectively, and preferred ranges thereof are also the same. $R^{11}$ to $R^{16}$ each represents a hydrogen atom or a substituent. As the substituent, those as enumerated as the substituent group A are applicable. $R^{11}$ to $R^{16}$ are each preferably a hydrogen atom, an alkyl group, an aryl group, an alkoxy group, an aryloxy group, an amino group, a cyano group, or a fluorine atom; more preferably a hydrogen atom, an alkyl group, an alkoxy group, or an amino group; and further preferably a hydrogen atom or an alkyl group.

The complex represented by the formula (I) or (II) is more preferably a complex represented by the following formula (III).

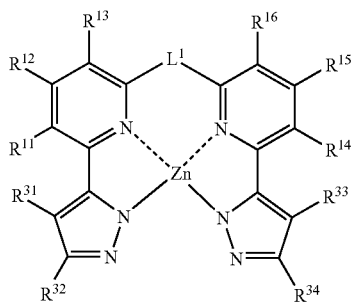

(III)

In the formula (III), $R^{11}$ to $R^{16}$ each independently represents a hydrogen atom or a substituent, provided that any one of $R^{11}$ to $R^{13}$ is not mutually bound to the other to form a fused aromatic ring and that any one of $R^{14}$ to $R^{16}$ is not mutually bound to the other to form a fused aromatic ring; $R^{31}$ to $R^{34}$ each independently represents a hydrogen atom or a substituent; and $L^1$ represents a connecting group.

$L^1$ and $R^{11}$ to $R^{16}$ are synonymous with those in the formula (II), respectively, and preferred ranges thereof are also the same. $R^{31}$ to $R^{34}$ each independently represents a hydrogen atom or a substituent. As the substituent, those as enumerated as the substituent group A are applicable. $R^{31}$ and $R^{33}$ are each preferably a hydrogen atom, an alkyl group, an aryl group, an alkoxy group, an aryloxy group, an amino group, a cyano group, or a fluorine atom; more preferably a hydrogen atom or an alkyl group; and especially preferably a hydrogen atom. $R^{32}$ and $R^{34}$ are each preferably a hydrogen atom, an alkyl group, an aryl group, an alkoxy group, an aryloxy group, an amino group, a cyano group, or a fluorine atom; more preferably a hydrogen atom, an alkoxy group, an aryl group, or a cyano group; further preferably a hydrogen atom or an alkyl group; and especially preferably an alkyl group.

Specific examples of the complex represented by the formula (I) in the invention will be given below, but it should not be construed that the invention is limited thereto (incidentally, Ph represents a phenyl group, and $^t$Bu represents a tertiary butyl group).

1.

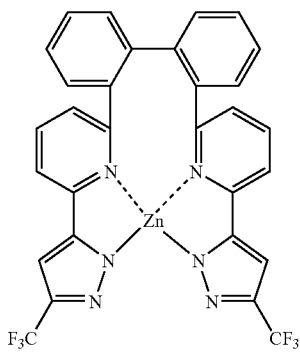

2.

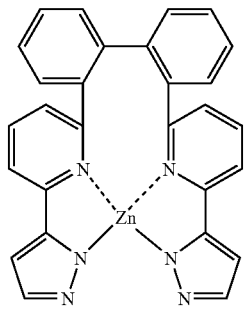

3.

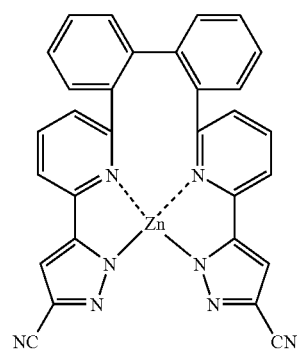

4.

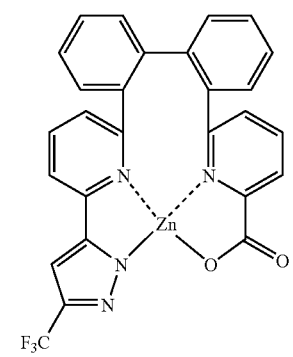

5.

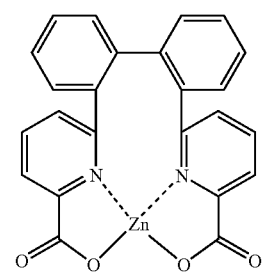

6. 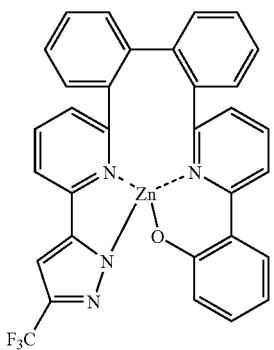
7. 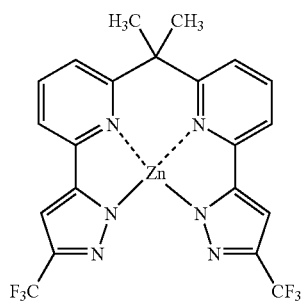
8. 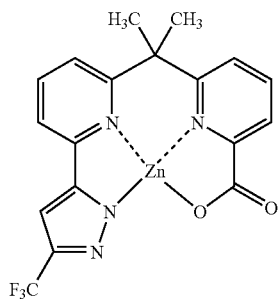
9. 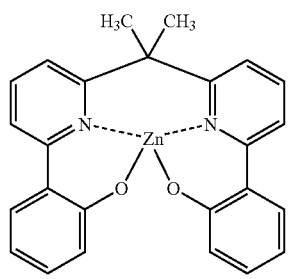
10. 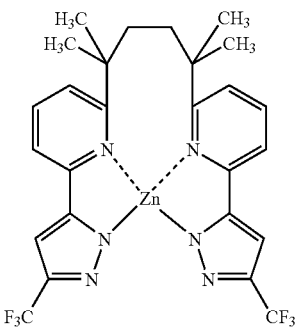
11. 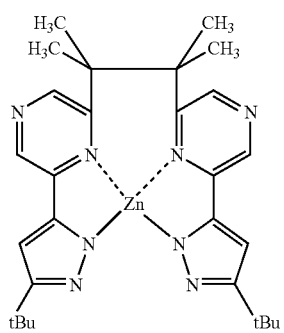
12. 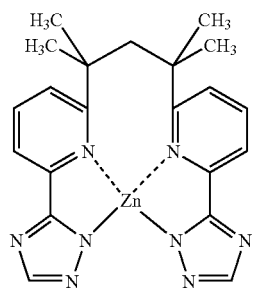
13. 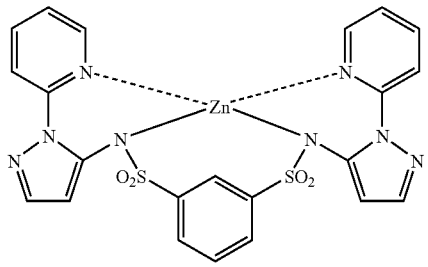
14. 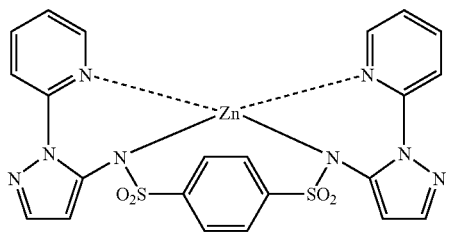

-continued
15. 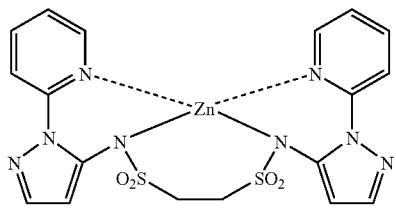
16. 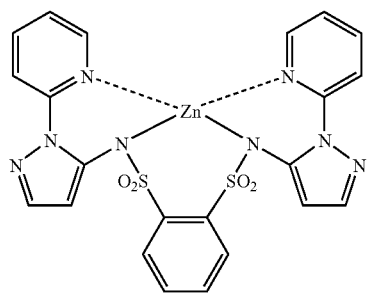
17. 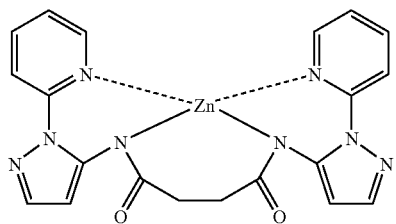
18. 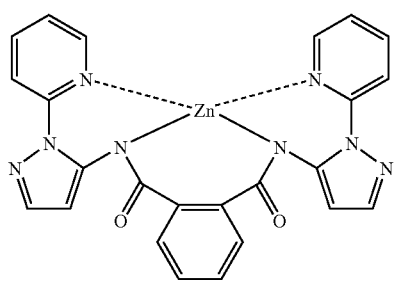
19. 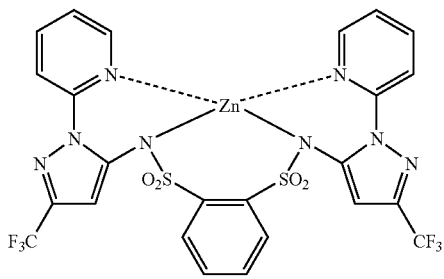
-continued
20. 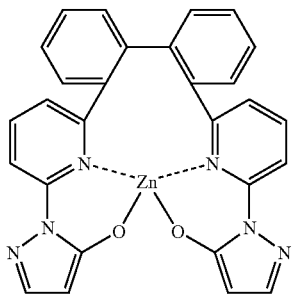
21. 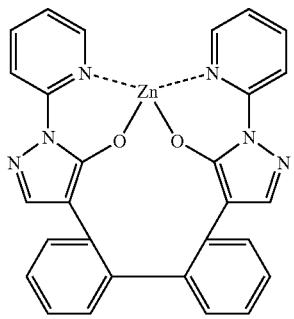
22. 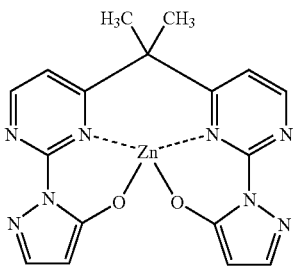
23. 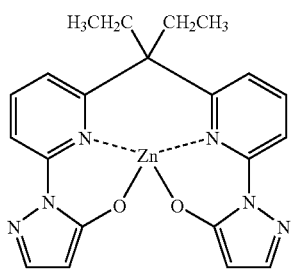
24. 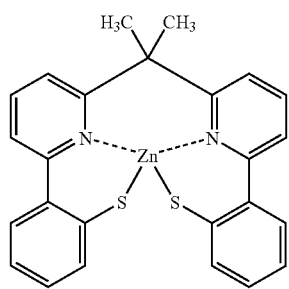

25.
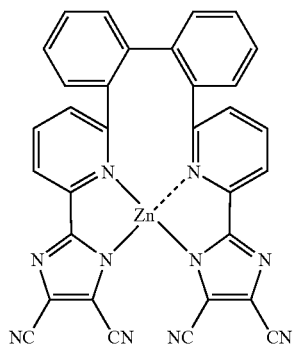

26.
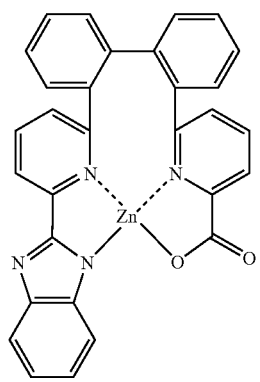

27.
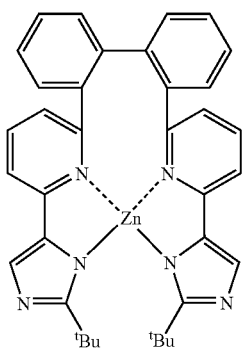

28.
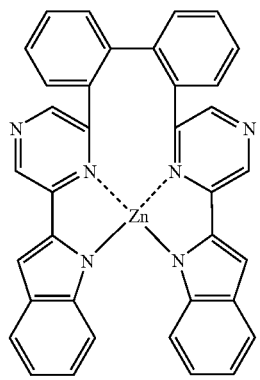

29.
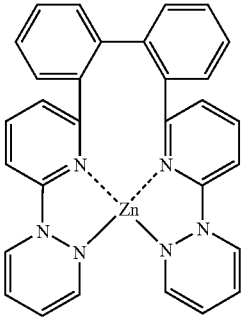

30.
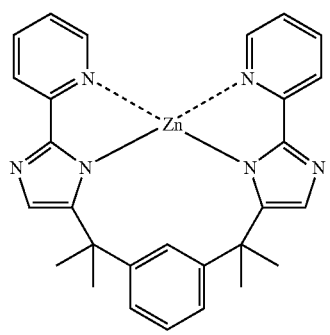

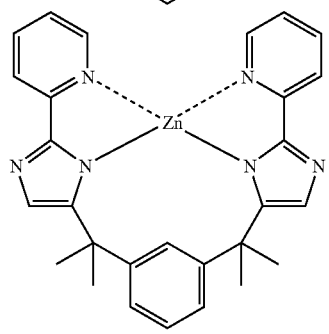

The compound represented by the formula (I) of the invention can be synthesized by various known synthesis methods.

Taking into consideration the durability of the device, a glass transition temperature (Tg) of the complex of the invention is preferably 130° C. or higher and not higher than 450° C., more preferably 135° C. or higher and not higher than 450° C., further preferably 140° C. or higher and not higher than 450° C., especially preferably 150° C. or higher and not higher than 450° C., and most preferably 160° C. or higher and not higher than 450° C.

Here, the Tg can be confirmed by thermal measurement such as differential scanning calorimetry (DSC) and differential thermal analysis (DTA), X-ray diffraction (XRD), polarizing microscopic observation, or the like.

In the case where the luminescent device of the invention is a luminescent device utilizing phosphorescence, a minimum excitation triplet energy level ($T_1$ level) of the complex of the invention is preferably 65 kcal/mole (273.35 kJ/mole) or more and not more than 95 kcal/mole (398.05 kJ/mole), more preferably 67 kcal/mole (280.73 kJ/mole) or more and not more than 95 kcal/mole (398.05 kJ/mole), and further preferably 69 kcal/mole (289.11 kJ/mole) or more and not more than 95 kcal/mole (398.05 kJ/mole).

Next, elements which configure the light emitting material of the invention will be hereunder described in detail.

<Substrate>

A substrate which is used in the invention is preferably a substrate which does not scatter or attenuate light emitted from the organic layer (organic compound layer). Specific examples thereof include inorganic materials such as yttrium stabilized zirconia (YSZ) and glass; and organic materials such as polyesters, for example, polyethylene terephthalate, polybutylene phthalate, and polyethylene naphthalate, polystyrenes, polycarbonates, polyethersulfones, polyallylates, polyimides, polycycloolefins, norbornene resins, and poly (chlorotrifluoroethylene).

For example, in the case where glass is used as the substrate, with respect to the quality of material, it is preferred to use no-alkali glass for the purpose of making the amount of eluting ions from the glass low. Furthermore, in the case where soda-lime glass is used as the substrate, it is preferred to use one having been applied with a barrier coat such as silica. The case where an organic material is used as the substrate is preferable because of its excellent heat resistance, dimensional stability, solvent resistance, electrical insulation and processability.

The substrate is not particularly limited with respect to the shape, structure and size and so on and can be properly selected depending upon the utility and purpose of the luminescent device and so on. In general, the shape of the substrate is preferably a plate-like shape. The structure of the substrate may be a single-layered structure or a stacked structure. Furthermore, the substrate may be formed of a single member or may be formed of two or more members.

The substrate may be colorless and transparent or may be colored and transparent. A colorless and transparent substrate is preferable because it does not scatter or attenuate light emitted from the organic light emitting layer.

The substrate can be provided with a moisture permeation preventing layer (gas barrier layer) on its front surface or back surface.

As a material of the moisture permeation preventing layer (gas barrier layer), an inorganic material such as silicon nitride and silicon oxide is suitably used. The moisture permeation preventing layer (gas barrier layer) can be, for example, formed by a high-frequency sputtering method.

In the case of using a thermoplastic substrate, a hard coat layer, an undercoat layer, or the like may be further provided, if desired.

<Anode>

Usually, an anode is only required to have a function to supply a hole to the organic layer as an electrode and is not particularly limited with respect to the shape, structure and size and so on. The anode can be properly selected among known electrode materials depending upon the utility and purpose of the luminescent device. As described previously, the anode is usually provided as a transparent anode.

Examples of a material of the anode include metals, alloys, metal oxides, conducting compounds, and mixtures thereof. Specific examples of the anode material include conducting metal oxides such as tin oxide doped with antimony, fluorine, etc. (for example, ATO and FTO), tin oxide, zinc oxide, indium oxide, indium tin oxide (ITO), and indium zinc oxide (IZO); metals such as gold, silver, chromium, and nickel; mixtures or stacks of such a metal and such a conducting metal oxide; inorganic conducting substances such as copper iodide and copper sulfide; organic conducting materials such as polyanilines, polythiophenes, and polypyrroles; and stacks thereof with ITO. Of these, conducting metal oxides are preferable; and ITO is especially preferable in view of productivity, high conductivity, transparency, and so on.

For example, the anode can be formed on the foregoing substrate according to a method which is properly selected while taking into consideration the adaptability with the material configuring the anode among wet systems such as a printing system and a coating system; physical systems such as a vacuum vapor deposition method, a sputtering method, and an ion plating method; and chemical systems such as a CVD method and a plasma CVD method. For example, in the case of selecting ITO as a material of the anode, the formation of the anode can be carried out according to a direct current or high-frequency sputtering method, a vacuum vapor deposition method, an ion plating method, or the like.

In the organic electroluminescent device of the invention, the position at which the anode is formed is not particularly limited and can be properly selected depending to the utility and purpose of the luminescent device. However, it is preferable that the anode is formed on the foregoing substrate. In this case, the anode may be form entirely on one surface of the substrate or may be formed on a part thereof.

Incidentally, the patterning in forming the anode may be made by chemical etching by photolithography or the like, may be made by physical etching by a laser or the like, may be made by vacuum vapor deposition, sputtering, or the like by superposing a mask, or may be made by liftoff technology or print processes.

The thickness of the anode can be properly selected depending upon a material which configures the anode and cannot be unequivocally defined. It is usually from about 10 nm to 50 µm, and preferably from 50 nm to 20 µm.

A resistivity value of the anode is preferably not more than $10^3$ $\Omega/\square$, and more preferably not more than $10^2$ $\Omega/\square$. In the case where the anode is transparent, the anode may be colorless and transparent or may be colored and transparent. In order to take out the light emission from the transparent anode side, its transmittance is preferably 60% or more, and more preferably 70% or more.

Incidentally, the transparent is described in detail in *Developments of Transparent Conducting Films*, supervised by Yutaka Sawada (published by CMC Publishing Co., Ltd., 1999), and the matters as described therein can be applied in the invention. In the case of using a plastic substrate with low heat resistance, a transparent anode resulting from film formation at a low temperature of not higher than 150° C. by using ITO and IZO is preferable.

<Cathode>

Usually, a cathode is only required to have a function to inject an electron into the organic layer as an electrode and is not particularly limited with respect to the shape, structure and size and so on. The cathode can be properly selected among known electrode materials depending upon the utility and purpose of the luminescent device.

Examples of a material which configures the cathode include metals, alloys, metal oxides, electrically conducting compounds, and mixtures thereof. Specific examples thereof include alkali metals (for example, Li, Na, K, and Cs), alkaline earth metals (for example, Mg and Ca), gold, silver, lead, aluminum, sodium-potassium alloys, lithium-aluminum alloys, magnesium-silver alloys, and rare earth metals (for example, indium and ytterbium). Though such a material may be used singly, two or more kinds thereof can be suitably used from the viewpoint of making both the stability and the electron injection properties compatible with each other.

Of these, as the material which configures the cathode, alkali metals and alkaline earth metals are preferable in view of the electron injection properties; and materials made of aluminum as the major component are preferable because of excellent storage stability thereof.

The "material made of aluminum as the major component" as referred to herein means aluminum alone or an alloy of aluminum and from 0.01 to 10% by weight of an alkali metal or an alkaline earth metal or a mixture thereof (for example, a lithium-aluminum alloy and a magnesium-aluminum alloy).

Incidentally, the material of the cathode is described in detail in JP-A-2-15595 and JP-A-5-121172. Materials as described in JP-A-2-15595 and JP-A-5-121172 can be applied in the invention, too.

The formation method of the cathode is not particularly limited and can be carried out according to known methods. For example, the cathode can be formed on the foregoing substrate according to a method which is properly selected while taking into consideration the adaptability with the foregoing material which configures the cathode among wet systems such as a printing system and a coating system; physical systems such as a vacuum vapor deposition method, a sputtering method, and an ion plating method; and chemical systems such as a CVD method and a plasma CVD method. For example, in the case of selecting a metal or the like as the material of the cathode, the formation can be carried out by sputtering one kind or two or more kinds thereof simultaneously or successively or other methods.

The patterning in forming the cathode may be made by chemical etching by photolithography or the like; may be made by physical etching by a laser or the like; may be made by vacuum vapor deposition, sputtering, or the like by superposing a mask; or may be made by a liftoff method or a printing method.

In the invention, the position at which the cathode is formed is not particularly limited, and the cathode may be formed entirely on the organic layer or may be formed on a part thereof.

Furthermore, a dielectric layer made of a fluoride, an oxide or the like of an alkali metal or an alkaline earth metal may be inserted in a thickness of from 0.1 to 5 nm between the cathode and the foregoing organic layer. This dielectric layer can be considered as one kind of electron injection layer. For example, the dielectric layer can be formed by a vacuum vapor deposition method, s puttering method, an ion plating method, or the like.

The thickness of the cathode can be properly selected depending upon a material which configures the cathode and cannot be unequivocally defined. It is usually from about 10 nm to 5 µm, and preferably from 50 nm to 1 µm.

Furthermore, the cathode may be transparent or may be opaque. Incidentally, the transparent cathode can be formed by subjecting the material of the cathode to film formation in a thin thickness of from 1 to 10 nm and further stacking a transparent conducting material such as ITO and IZO thereon.

<Organic Layer>

The organic layer in the invention will be hereunder described.

The organic electroluminescent device of the invention has at least one organic layer containing a light emitting layer. As other organic layers than the organic light emitting layer, as described previously, respective layers such as a hole transport layer, an electron transport layer, a charge blocking layer, a hole injection layer, and an electron injection layer are enumerated.

—Formation of Organic Layer—

In the organic electroluminescent device of the invention, the respective layers which configure the organic layer can be suitably formed by any of a dry film formation method such as a vapor deposition method and a sputtering method, a transfer method, a printing method, and so on.

—Organic Light Emitting Layer—

The organic light emitting layer is a layer having a function to receive a hole from the anode, the hole injection layer or the hole transport layer and to receive an electron from the cathode, the electron injection layer or the electron transport layer at the time of applying an electric field, thereby providing a place of the recombination of the hole and the electron to cause light emission.

The light emitting layer in the invention may be configured of only a light emitting material or may be configured as a mixed layer of a host material and a light emitting material. The light emitting material may be a fluorescence emitting material or a phosphorescent material, and a dopant may be made of one or two or more kinds thereof. The host material is preferably a charge transport material. The host material may be made of one or two or more kinds thereof. For example, a configuration in which an electron transporting host material and a hole transporting host material are mixed is enumerated. In addition, a material which does not have charge transporting properties and which does not cause light emission may be contained in the light emitting layer.

Furthermore, the light emitting layer may be made of one layer or two or more layers. The respective layers may cause light emission in a different light emitting color.

Examples of the fluorescence emitting material which can be used in the invention include benzoxazole derivatives, benzimidazole derivatives, benzothiazole derivatives, stylylbenzene derivatives, polyphenyl derivatives, diphenylbutadiene derivatives, tetraphenylbutadiene derivatives, naphthalimide derivatives, coumarin derivatives, fused aromatic compounds, perinone derivatives, oxadiazole derivatives, oxazine derivatives, aldazine derivatives, pyralidine derivatives, cyclopentadiene derivatives, bis(styryl)anthracene derivatives, quinacridon derivatives; pyrrolopyridine derivatives, thiadiazolopyridine derivatives, cyclopentadiene derivatives, styrylamine derivatives, diketopyrrolopyrrole derivatives, aromatic dimethylidine compounds, various metal complexes represented by metal complexes of 8-quinolinol derivatives and metal complexes of pyromethene derivatives, polymer compounds (for example, polythiophene, polyphenylene, and polyphenylenevinylene), and compounds such as organosilane derivatives.

Furthermore, examples of the phosphorescent material which can be used in the invention include complexes containing a transition metal atom or a lanthanoid atom.

The transition metal atom is not particularly limited. Preferred examples thereof include ruthenium, rhodium, palladium, tungsten, rhenium, osmium, iridium, and platinum, with rhenium, iridium and platinum being more preferable.

Examples of the lanthanoid atom include lanthanum, cerium, praseodymium, neodymium, samarium, europium, gadolinium, terbium, dysprosium, holmium, erbium, thulium, ytterbium, and lutetium. Of these lanthanoid atoms, neodymium, europium and gadolinium are preferable.

Examples of a ligand of the complex include ligands as described in G. Wilkinson, et al., *Comprehensive Coordination Chemistry*, pulished by Pergamon Process, 1987; H. Yersin, *Photochemistry and Photophysics of Coordination Compounds*, published by Springer-Verlag, 1987; and Akio Yamamoto, *Organometallic Chemistry—Principles and Applications*, published by Shokabo Publishing Co., Ltd., 1982.

Concretely, as the ligand, halogen ligands (preferably a chlorine ligand), nitrogen-containing heterocyclic ligands (for example, phenylpyridine, benzoquinoline, quinilol, bipyridyl, and phenanthroline), diketone ligands (for example, acetylacetone), carboxylic acid ligands (for example, an acetic acid ligand), a carbon monoxide ligand, an isonitrile ligand, and a cyano ligand are preferable, with nitrogen-containing heterocyclic ligands being more preferable. The foregoing complex may contain one transition metal atom in the compound thereof or may be a so-called polynuclear complex containing two or more transition metal atoms therein. The complex may contain metal atoms of a different kind as the same time.

The phosphorescent material is preferably contained in an amount of from 0.1 to 40% by weight, and more preferably from 0.5 to 20% by weight in the light emitting layer.

Furthermore, examples of the host material which is contained in the light emitting layer in the invention include, in addition to the complex of the invention, materials as enumerated in the following paragraphs of hole injection layer, hole transport layer, electron injection layer and electron transport layer as well as a material having a carbazole skeleton, a material having a diarylamine skeleton, a material having a pyridine skeleton, a material having a pyrazine skeleton, a material having a triazine skeleton, and a material having an arylsilane skeleton.

The thickness of the light emitting layer is not particularly limited. However, in general, the thickness of the light emitting layer is preferably from 1 nm to 500 nm, more preferably from 5 nm to 200 nm, and further preferably from 10 nm to 100 nm.

Hole Injection Layer and Hole Transport Layer

The hole injection layer and the hole transport layer are each a layer having a function to receive a hole from the anode or the anode side to transport it into the cathode side. Concretely, the hole injection layer and the hole transport layer are each preferably a layer containing carbazole derivatives, triazole derivatives, oxazole derivatives, oxadiazole derivatives, imidazole derivatives, poly-arylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene based compounds, porphyrin based compounds, organosilane derivatives, carbon, etc.

The thickness of each of the hole injection layer and the hole transport layer is preferably not more than 500 nm from the viewpoint of reducing a drive voltage.

The thickness of the hole transport layer is preferably from 1 nm to 500 nm, more preferably from 5 nm to 200 nm, and further preferably from 10 nm to 100 nm. Furthermore, the thickness of the hole injection layer is preferably from 0.1 nm to 200 nm, more preferably from 0.5 nm to 100 nm, and further preferably from 1 nm to 100 nm.

Each of the hole injection layer and the hole transport layer may be of a single-layered structure made of one or two or more kinds of the foregoing materials or may be of a multi-layered structure made of plural layers of the same composition or a different composition.

—Electron Injection Layer and Electron Transport—Layer

The electron injection layer and the electron transport are each a layer having a function to receive an electron from the cathode or the cathode side to transport it into the anode side. Concretely, the electron injection layer and the electron transport layer are each preferably a layer containing, in addition to the complex of the invention, triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, aromatic ring tetracarboxylic acid anhydrides of naphthalene, perylene, etc., phthalocyanine derivatives, various metal complexes represented by metal complexes of 8-quinolinol derivatives and metal complexes of pyromethene derivatives, metal complexes of 8-quinolinol derivatives and metal complexes made of, as a ligand, metal phthalocyane, benzoxazole or benzothiazole, organosilane derivatives, etc.

The thickness of each of the electron injection layer and the electron transport layer is preferably not more than 500 nm from the viewpoint of reducing a drive voltage.

The thickness of the electron transport layer is preferably from 1 nm to 500 nm, more preferably from 5 nm to 200 nm, and further preferably from 10 nm to 100 nm. Furthermore, the thickness of the electron injection layer is preferably from 0.1 nm to 200 nm, more preferably from 0.2 nm to 100 nm, and further preferably from 0.1 nm to 50 nm.

Each of the electron injection layer and the electron transport layer may be of a single-layered structure made of one or two or more kinds of the foregoing materials or may be of a multilayered structure made of plural layers of the same composition or a different composition.

—Hole Blocking Layer—

The hole blocking layer is a layer having a function to prevent the matter that the hole which has been transported into the light emitting layer from the anode side passes through into the cathode side. In the invention, the hole blocking layer can be provided as an organic layer which is positioned adjacent to the light emitting layer in the cathode side.

Examples of an organic compound which configures the hole blocking layer include aluminum complexes such as BAlq, triazole derivatives, and phenanthroline derivatives such as BCP.

The thickness of the hole blocking layer is preferably from 1 nm to 500 nm, more preferably from 5 nm to 200 nm, and further preferably from 10 nm to 100 nm.

The hole blocking layer may be of a single-layered structure made of one or two or more kinds of the foregoing materials or may be of a multilayered structure made of plural layers of the same composition or a different composition.

<Protective Layer>

In the invention, the whole of the organic EL device may be protected by a protective layer.

As a material which is contained in the protective layer, a material having a function to inhibit the matter that a substance which promotes the deterioration of the device such as moisture and oxygen comes into the device may be used.

Specific examples thereof include metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$ and $SiN_xO_y$; metal fluorides such as $MgF_2$, LiF, $AlF_3$, and $CaF_2$; polyethylene; polypropylene; polymethyl methacrylate; polyimides; polyureas; polytetrafluoroethylene; polychlorotrifluoroethylene; poly-dichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers having a cyclic structure in the copolymer principal chain; water-absorbing substances having a water absorptivity of 1% or more; and moisture-proof substances having a water absorptivity of not more than 0.1%.

The formation method of the protective layer is not particularly limited, and examples thereof include a vacuum vapor deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method, and a transfer method.

<Sealing>

In addition, in the organic electroluminescent device of the invention, the whole of the device may be sealed by using a sealing container.

Furthermore, a moisture absorber or an inert liquid may be enclosed in a space between the sealing container and the luminescent device. The moisture absorber is not particularly limited. Examples of the moisture absorber which can be used include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited, and examples thereof include paraffins, liquid paraffins, fluorine based solvents such as perfluoroalkanes, perfluoroamines and perfluoroethers, chlorine based solvents, and silicone oils.

In the organic electroluminescent device of the invention, the light emission can be obtained by applying a direct current (may contain an alternate current component, if desired) voltage (usually from 2 volts to 15 volts) or a direct current between the anode and the cathode.

With respect to the drive method of the organic electroluminescent device of the invention, drive methods as described in, for example, JP-A-2-148687, JP-A-6-301355, JP-A-5-29080, JP-A-7-134558, JP-A-8-234685, JP-A-8-241047, Japanese Patent No. 2784615, and U.S. Pat. Nos. 5,828,429 and 6,023,308 can be applied.

EXAMPLES

The invention will be hereunder described in more detail with reference to the following Examples, but it should not be construed that the invention is limited thereto.

Comparative Example 1

An ITO film-provided glass substrate having a thickness of 0.5 mm and a square of 2.5 cm (manufacture by Geomatec Co., Ltd., surface resistivity: 10 Ω/□) was charged in a cleaning container, ultrasonically cleaned in 2-propanol, and then subjected to a UV-ozone treatment for 30 minutes. The following organic layers were successively vapor deposited on this transparent anode (ITO film) by a vacuum vapor deposition method.

A vapor deposition rate in the Examples of the invention is 0.2 nm/sec unless otherwise indicated. The vapor deposition rate was measured by using a quartz oscillator. The film thickness as described below is one as measured using a quartz oscillator, too.

(First Hole Transport Layer)
  Copper phthalocyanine (CuPC):film thickness, 10 nm (Second Hole Transport Layer)
  NPD: film thickness, 40 nm (Light Emitting Layer)
  Mixed layer of Znq (92% by weight) and Ir(ppy)$_3$ (8% by weight): film thickness, 30 nm (First Electron Transport Layer)
  BAlq: film thickness, 10 nm (Second Electron Transport Layer)
  Alq: film thickness, 10 nm Chemical structures of the foregoing CuPC, NPD, Znq, Alq and BAlq are as follows.

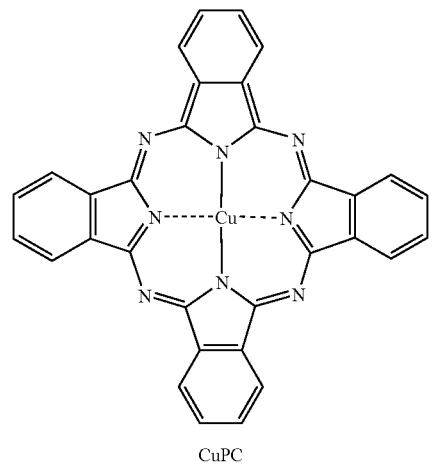

CuPC

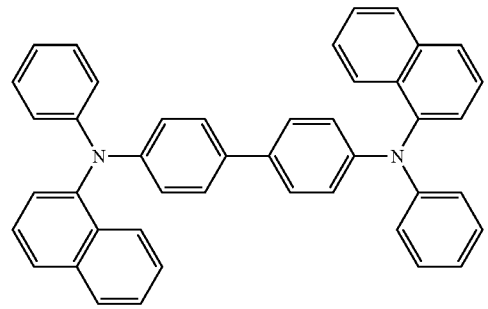

NPD

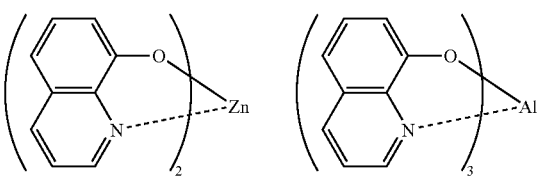

Znq          Alq

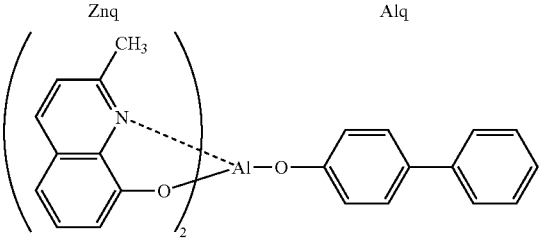

BAlq

Finally, 0.1 nm of lithium fluoride and 100 nm of metallic aluminum were vapor deposited in this order to prepare a cathode.

This cathode was charged in an argon gas-purged glove box so as to avoid contact with the air and then sealed by using a stainless steel-made sealing can and an ultraviolet ray-curable adhesive (XNR5516HV, manufactured by Nagase-CIBA Ltd.), thereby obtaining an organic electroluminescent device of Comparative Example 1.

Comparative Example 2

An organic electroluminescent device of Comparative Example 2 was prepared in the same manner as in the organic electroluminescent device of Comparative Example 1, except for changing the Znq to $Zn(BOX)_2$ having the following structure.

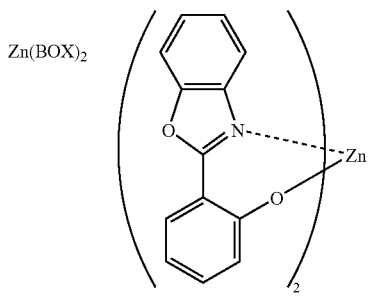

Example 1

An organic electroluminescent device of Example 1 was prepared in the same manner as in the organic electroluminescent device of Comparative Example 1, except for changing the Znq to Illustrative Compound 1 of the invention.

A voltage of 10 V was applied to each of the devices of Example 1 and Comparative Examples 1 and 2. As a result, in the luminescent devices of Example 1 and Comparative Example 2, light emission derived from $Ir(ppy)_3$ was obtained, whereas in Comparative Example 1, light emission derived from $Ir(ppy)_3$ was not observed.

Each of the devices of Example 1 and Comparative Example 2 was set in OLED Test System ST-D Model as manufactured by Tokyo System Kaihatsu Co., Ltd. and driven under a condition of 0.4 mA of a forward constant current in a constant current mode, thereby determining a half life $t_{0.5}$ of luminance (time until the luminance is lowered to 50% of the initial luminance). As a result, the device of Comparative Example 2 had a half life of 30 minutes, whereas the device of Example 1 had a half life of 18 hours.

As is clear from the foregoing Examples, by using the compound of the invention, an organic electroluminescent device having high efficiency and high durability is obtained.

This application is based on Japanese Patent application JP 2005-284829, filed Sep. 29, 2005, the entire content of which is hereby incorporated by reference, the same as if set forth at length.

What is claimed is:

1. An organic electroluminescent device comprising a pair of electrodes and at least one organic layer between the pair of electrodes, wherein the organic layer contains at least one compound represented by the following formula (I):

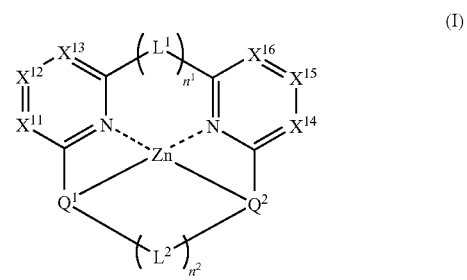

wherein $X^{11}$ to $X^{16}$ each independently represents C—R or N; R represents a hydrogen atom or a substituent, provided that Rs are not bound to each other to form a fused aromatic ring; $Q^1$ and $Q^2$ each independently represents a coordinating group which is bound to zinc at the O, N or S atom; $L^1$ and $L^2$ each independently represents a connecting group; and $n^1$ and $n^2$ each represents 0 or 1, provided that sum of $n^1$ and $n^2$ is 1.

2. The organic electroluminescent device as claimed in claim 1, wherein the compound represented by the formula (I) is represented by the following formula (II):

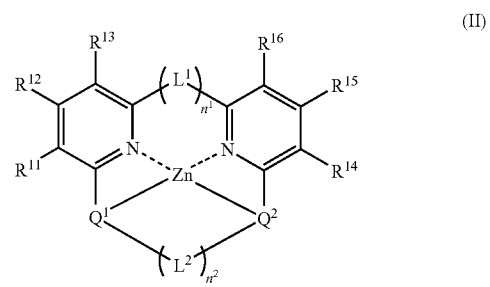

wherein $R^{11}$ to $R^{16}$ each independently represents a hydrogen atom or a substituent, provided that each of $R^{11}$ to $R^{13}$ is not bound to other of $R^{11}$ to $R^{13}$ to form a fused aromatic ring and that each of $R^{14}$ to $R^{16}$ is not bound to other of $R^{14}$ to $R^{16}$ to form a fused aromatic ring; $Q^1$ and $Q^2$ each independently represents a coordinating group which is bound to zinc at the O, N or S atom; $L^1$ and $L^2$ each independently represents a connecting group; and $n^1$ and $n^2$ each represents 0 or 1, provided that sum of $n^1$ and $n^2$ is 1.

3. The organic electroluminescent device as claimed in claim 1, wherein the compound represented by the formula (I) is represented by the following formula (III):

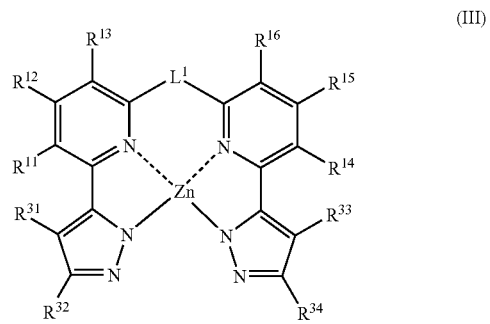

wherein $R^{11}$ to $R^{16}$ each independently represents a hydrogen atom or a substituent, provided that each of $R^{11}$ to $R^{13}$ is not bound to other of $R^{11}$ to $R^{13}$ to form a fused aromatic ring and that each of $R^{14}$ to $R^{16}$ is not bound to other of $R^{14}$ to $R^{16}$ to form a fused aromatic ring; $R^{31}$ to $R^{34}$ each independently represents a hydrogen atom or a substituent; and $L^1$ represents a connecting group.

4. The organic electroluminescent device as claimed in claim 1, wherein the compound represented by the formula (I) is represented by one of the following formulae 1 to 30:

1.

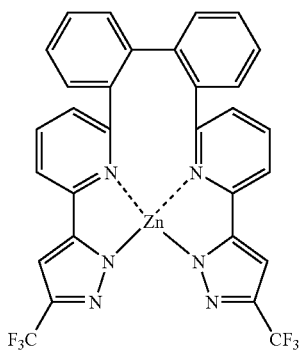

2.

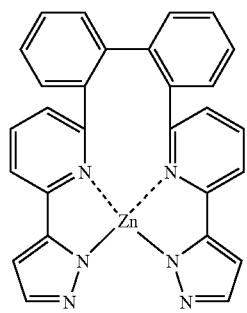

3.

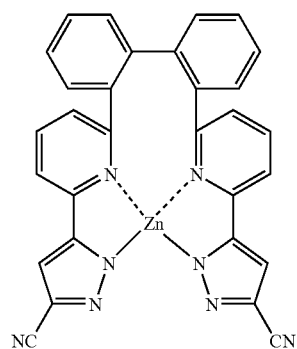

4.

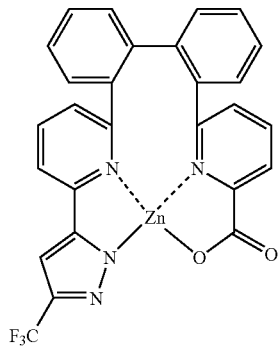

-continued

5.

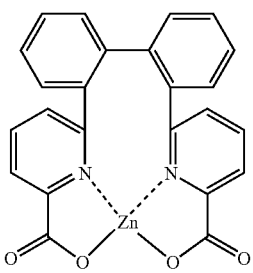

6.

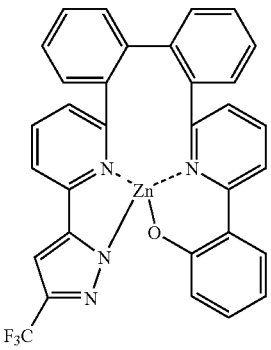

7.

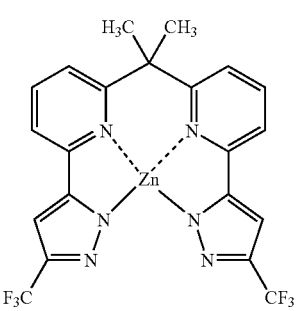

8.

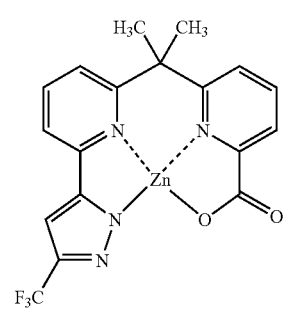

9.

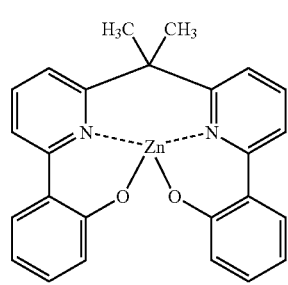

-continued
10. 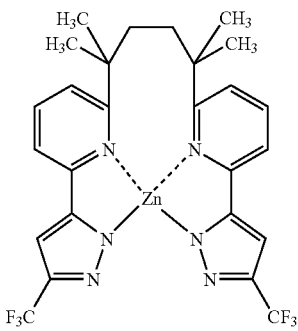
11. 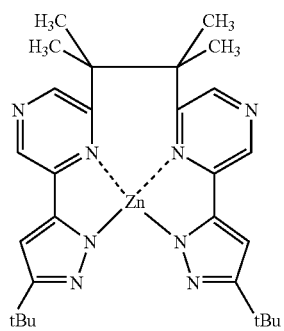
12. 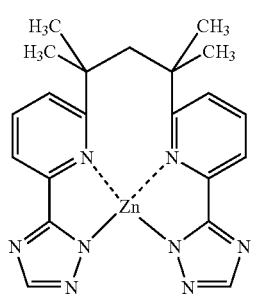
13. 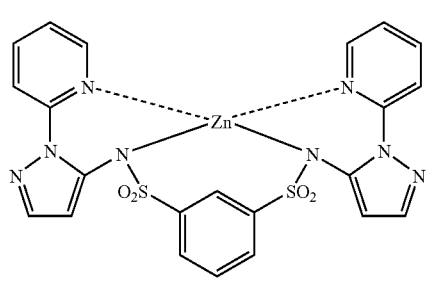
14. 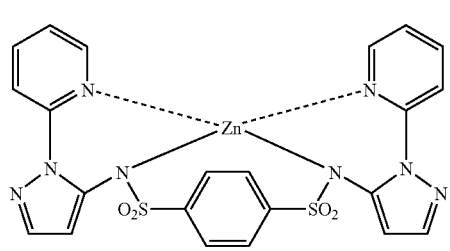
-continued
15. 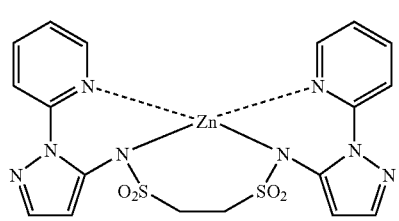
16. 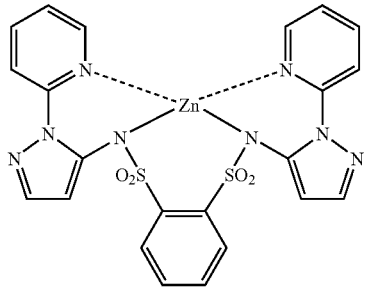
17. 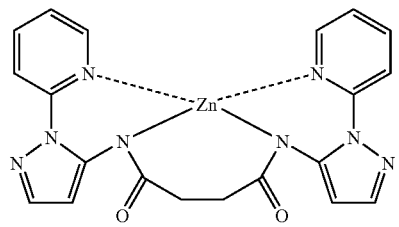
18. 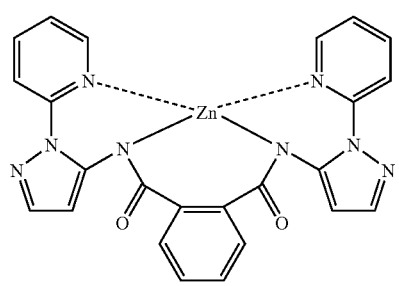
19. 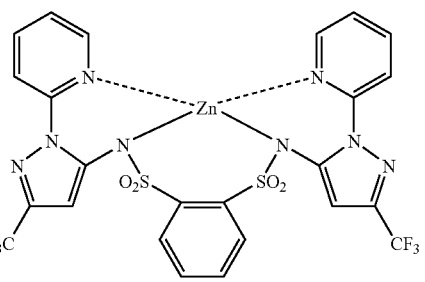

-continued
20. 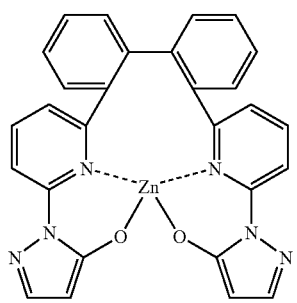
21. 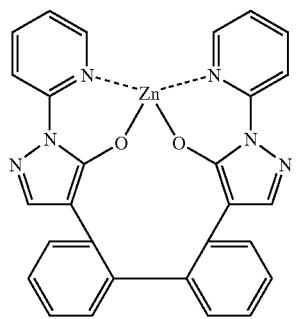
22. 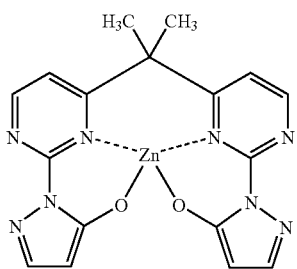
23. 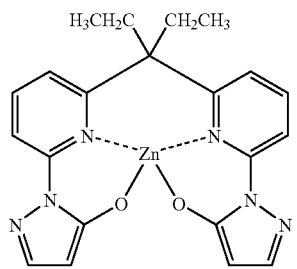
24. 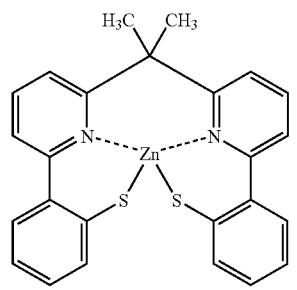
-continued
25. 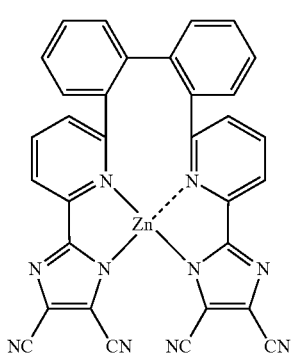
26. 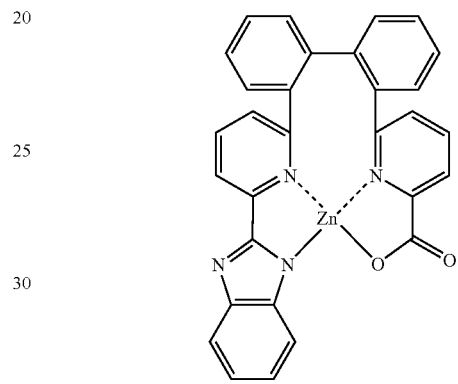
27. 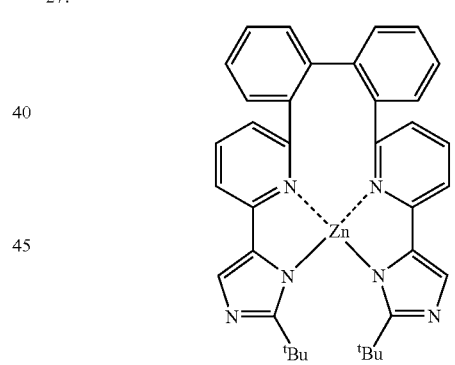
28. 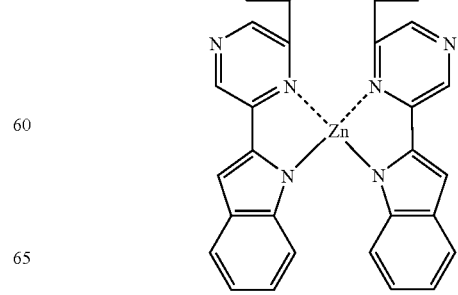

-continued

29.
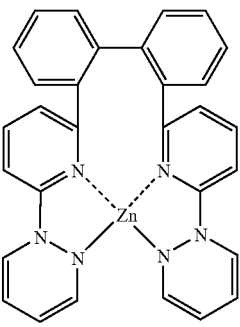

30.
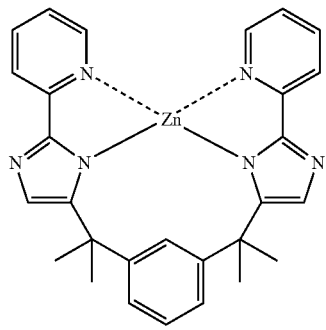

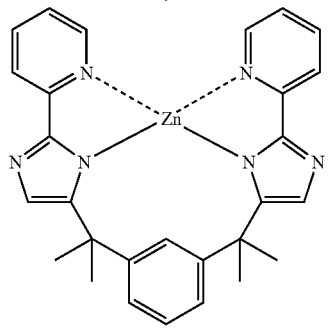

wherein Ph represents a phenyl group, and $^t$Bu represents a tertiary butyl group.

5. The organic electroluminescent device as claimed in claim 1, wherein the compound represented by the formula (I) has a glass transition temperature of from 130° C. to 450° C.

6. The organic electroluminescent device as claimed in claim 1, wherein the compound represented by the formula (I) has a glass transition temperature of from 135° C. to 450° C.

7. The organic electroluminescent device as claimed in claim 1, wherein the compound represented by the formula (I) has a glass transition temperature of from 140° C. to 450° C.

8. The organic electroluminescent device as claimed in claim 1, wherein the compound represented by the formula (I) has a glass transition temperature of from 150° C. to 450° C.

9. The organic electroluminescent device as claimed in claim 1, wherein the compound represented by the formula (I) has a glass transition temperature of from 160° C. to 450° C.

10. The organic electroluminescent device as claimed in claim 1, wherein the at least one organic layer contains at least one light emitting material, and at least one of the light emitting material is a phosphorescent material.

11. The organic electroluminescent device as claimed in claim 1, wherein the compound represented by the formula has a minimum excitation triplet energy level of from 65 kcal/mole to 95 kcal/mole.

12. The organic electroluminescent device as claimed in claim 1, wherein the compound represented by the formula has a minimum excitation triplet energy level of from 67 kcal/mole to 95 kcal/mole.

13. The organic electroluminescent device as claimed in claim 1, wherein the compound represented by the formula has a minimum excitation triplet energy level of from 69 kcal/mole to 95 kcal/mole.

* * * * *